United States Patent
Sakamoto (10) Patent No.: US 7,443,043 B2
(45) Date of Patent: Oct. 28, 2008

(54) CIRCUIT DEVICE AND METHOD OF MANUFACTURE THEREOF

(75) Inventor: Noriaki Sakamoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 269 days.

(21) Appl. No.: 10/733,724

(22) Filed: Dec. 11, 2003

(65) Prior Publication Data
US 2004/0164430 A1    Aug. 26, 2004

(30) Foreign Application Priority Data
Dec. 20, 2002    (JP) .................. P.2002-371026

(51) Int. Cl.
*H01L 21/44*    (2006.01)
(52) U.S. Cl. .............. 257/787; 257/782; 257/784
(58) Field of Classification Search .......... 257/782, 257/784, 787
See application file for complete search history.

(56) References Cited

U.S. PATENT DOCUMENTS

| | | | | |
|---|---|---|---|---|
| 6,143,981 A | * | 11/2000 | Glenn | 174/534 |
| 6,281,047 B1 | * | 8/2001 | Wu et al. | 438/113 |
| 6,608,366 B1 | * | 8/2003 | Fogelson et al. | 257/666 |
| 6,630,729 B2 | * | 10/2003 | Huang | 257/787 |
| 6,836,009 B2 | * | 12/2004 | Koon et al. | 257/692 |
| 2002/0056926 A1 | * | 5/2002 | Jung et al. | 257/786 |
| 2003/0164554 A1 | * | 9/2003 | Fee et al. | 257/787 |

* cited by examiner

*Primary Examiner*—Leonardo Andújar
(74) *Attorney, Agent, or Firm*—Fish & Richardson P.C.

(57) ABSTRACT

A circuit device 10 comprises a die pad 11, bonding pads 12, a circuit element 9, affixed onto die pad 11, and an insulating resin 14, which seals die pad 11, bonding pads 12, and circuit element 9, and has a configuration wherein recessed parts 15 are formed at parts of the side surfaces of insulating resin 14, and side surface of the conductive patterns that are disposed at peripheral parts are exposed from recessed parts 15. By bonding pads 12, which are to become connecting electrodes to the exterior, being exposed at the side surfaces, fillets of a brazing material 19 are formed at the sides of the device when circuit device 10 is mounted.

10 Claims, 13 Drawing Sheets

CIRCUIT DEVICE AND METHOD OF MANUFACTURE THEREOF

BACKGROUND OF THE INVENTION

1. Field of the Invention

The present invention relates to a circuit device, with which conductive patterns, which are to be electrodes, are exposed from side surfaces of an insulating resin that seals the entire circuit device, and a method of manufacturing such a circuit device.

2. Description of the Related Art

Conventionally, due to being employed in portable telephones, portable computers, etc., circuit devices that are set in electronic equipment have been demanded to be compact, thin, and lightweight. Among related-art circuit devices, there is that which is called a CSP (Chip Size Package).

Figure 18:
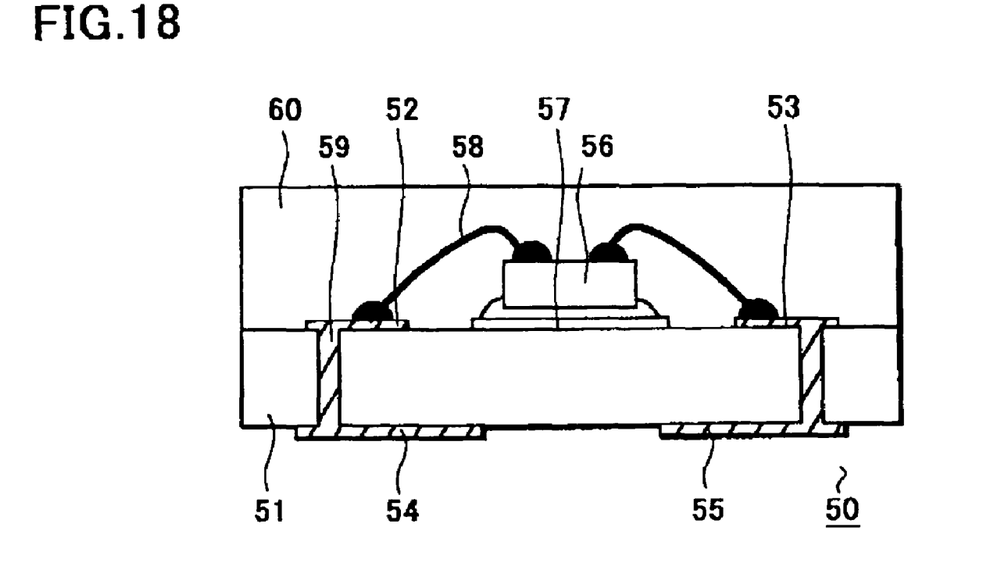
FIG. 18 is a sectional view showing a related-art circuit device.

FIG. 18 shows a CSP 50, which is slightly larger than a chip size and employs a glass epoxy substrate 51 as the supporting substrate. Here, a description shall be provided for the case where a transistor chip 56 is mounted onto glass epoxy substrate 51.

A first electrode 52, a second electrode 53, and a die pad 57 are formed on the surface of this glass epoxy substrate 51. And a first rear surface electrode 54 and a second rear surface electrode 55 are formed on the rear surface of the glass epoxy substrate 51. Via through holes 59, the first electrode 52 is electrically connected with first rear surface electrode 54 and second electrode 53 is electrically connected with second rear surface electrode 55. The transistor chip 55 is affixed in bare form onto die pad 57, the emitter electrode of the transistor is connected via a metal wire 58 to first electrode 52, and the base electrode of the transistor is connected via a metal wire 58 to second electrode 53. Furthermore, a resin layer 60 is provided on glass epoxy substrate 51 so as to cover transistor chip T.

Though employing a glass epoxy substrate 51, the CSP 50, unlike a wafer-scale CSP, has the merits of being simple in the extension structure from chip T to the rear surface electrodes 54 and 55 for external connection and being inexpensive to manufacture.

With the above-described CSP or other related-art type circuit device, first rear surface electrode 54 and second rear surface electrode 55 for electrical connection with the exterior are provided at the rear surface of the device. The device is mounted onto a mother board, etc., by attaching soft solder or other brazing material to the rear surface electrodes by a reflow process, etc. However, after mounting, it was difficult to visually judge whether or not the brazing material has an appropriate shape since the brazing material is formed in the minute gap between the rear surface of CSP 50 and the mother board.

Furthermore, first rear surface electrode 54 and second rear surface electrode 55 are formed on the rear surface of glass epoxy substrate 51 and protrusions are formed due to the thickness of these electrodes. There was thus the problem that the rear surface electrodes, which have been formed in a protruding manner, peeled off in the process of conveying a completed CSP 50.

This preferred embodiment of invention has been made in view of such problems, and an object of this preferred embodiment of invention is to provide a circuit device, with which conductive patterns are exposed from the side surfaces of an insulating resin sealing the entire circuit device, and a method of manufacturing such a circuit device.

SUMMARY OF THE INVENTION

The preferred embodiment of this invention firstly provide a circuit device comprising: conductive pattern; circuit element, affixed onto the conductive patterns; and an insulating resin, sealing the conductive pattern and the circuit element while exposing at least the bottom surface of the conductive pattern; wherein recessed part is formed at the side surface of the insulating resin, and side surface of the conductive pattern that is disposed at peripheral parts is exposed from the recessed part.

By exposing side surfaces of the conductive patterns that are disposed at the peripheral parts, the circuit device can be mounted by attaching soft solder or other brazing material to the exposed side surface parts of the conductive patterns, thereby enabling pass/fail judgment of mounting to be made visually.

The preferred embodiment of this invention secondly provides a circuit device manufacturing method comprising: preparing a conductive foil and forming separation grooves that are shallower than the thickness of the conductive foil at least at region of the conductive foil except region to be conductive pattern that form a plurality of mounting portions for circuit element; affixing the circuit element onto the respective mounting portions of the conductive pattern; performing molding with an insulating resin so as to cover the circuit element at the respective mounting portions in a batch and fill the separation groove; removing the back surface of the conductive foil until the insulating resin is exposed; removing the conductive patterns at locations corresponding to boundary of the respective mounting portions to form grooves and thereby expose side surface of the conductive patterns; and performing separation by dicing the insulating resin along the boundary.

The preferred embodiment of this invention thirdly provides a circuit device manufacturing method comprising: preparing a conductive foil; forming separation groove that is shallower than the thickness of the conductive foil at least at region of the conductive foil except region to be conductive patterns that form a plurality of mounting portions for circuit element; affixing the circuit element onto the respective mounting portions of the conductive pattern; performing molding with an insulating resin so as to cover the circuit element at the respective mounting portions in a batch and fill the separation grooves; removing the remaining thickness part of the separation grooves to electrically separate the conductive patterns and removing the conductive foil at locations corresponding to boundary of the respective mounting portions to form grooves and thereby expose side surface of the conductive pattern; and performing separation by dicing the insulating resin along the boundary.

The preferred embodiment of the present invention provides the following effects.

Firstly, since side surfaces of bonding pads 12, which are to be connecting electrodes to the exterior, are exposed from insulating resin 14, when the circuit device is mounted using brazing material 19, fillets of brazing material 19 are formed at the sides of the circuit device. Pass/fail judgment of the attachment of the brazing material can thus be made visually after mounting.

Secondly, recessed parts 15 are formed at side surfaces of insulating resin 14 at locations at which side surfaces of bonding pads 12 are exposed. Since the exposed side surfaces of bonding pads 12 are thus set at the interior of insulating resin 14, the peeling of bonding pads 12 from insulating resin 14 can be prevented.

Thirdly, by forming a plurality of mounting portions 25 in matrix form on a block 22 and removing the conductive patterns at locations corresponding to the boundary lines of mounting portions 25, side surfaces of the conductive patterns of the respective mounting portions 25 can be exposed to the sides.

Fourthly, by electrically connecting bonding pads 12 of mounting portions 25 that are adjacent each other by plating film 17, apart of conductive foil 20 maybe used as an electrode to form plating layer 18 by an electrolytic plating method.

DESCRIPTION OF THE DRAWINGS

FIG. 2 is a plan view (A) and a sectional view (B) showing a circuit device of the present embodiment.

FIG. 3 is a plan view (A) and a sectional view (B) showing a circuit device of the present embodiment.

FIG. 4 is a plan view (A) and a sectional view (B) showing a circuit device of present embodiment.

FIG. 5 is a perspective view (A) and a sectional view (B) showing a circuit device of the present embodiment.

FIG. 6 is a sectional view (A) and a plan view (B) showing a circuit device manufacturing method of the present embodiment.

FIG. 8 is a sectional view (A) and a plan view (B) showing a circuit device manufacturing method of the present embodiment.

FIG. 9 is a sectional view (A) and a plan view (B) showing a circuit device manufacturing method of the present embodiment.

FIG. 10 is a sectional view (A) and a plan view (B) showing a device manufacturing method of the present embodiment.

FIG. 17 is a sectional view (A) and a plan view (B) showing a circuit device manufacturing method of the present embodiment.

DESCRIPTION OF THE PREFERRED EMBODIMENTS

First Embodiment for Describing the Configuration of a Circuit Device 10

Figure 1:
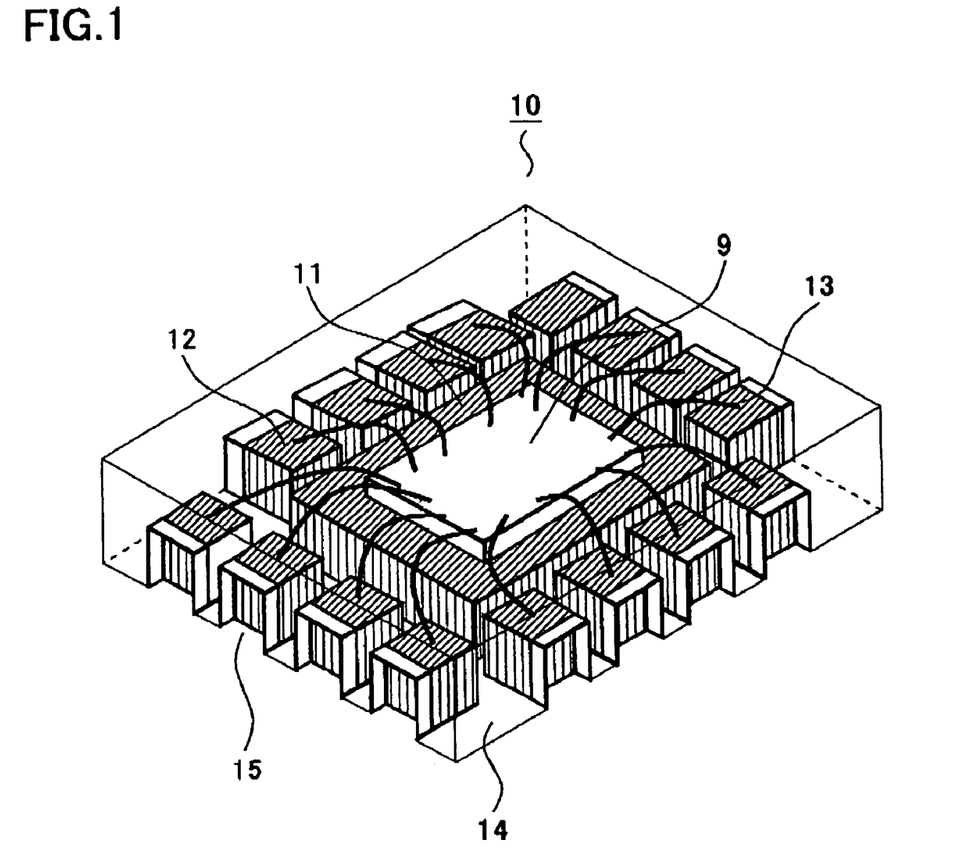
FIG. 1 is a perspective view showing a circuit device of the present embodiment.
Figure 2A:
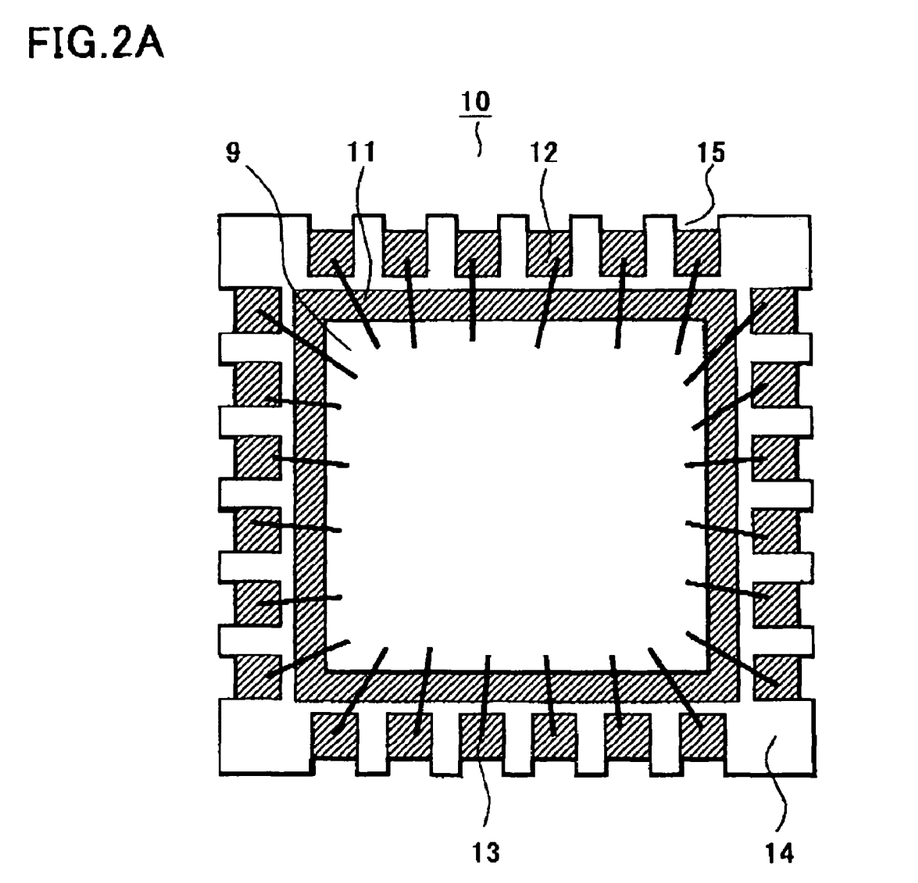

The configuration, etc. of a circuit device 10 of the preferred embodiment shall now be described with reference to FIG. 1 and FIG. 2. FIG. 1 is a perspective view of circuit device 10, FIG. 2(A) is a plan view of circuit device 10, and FIG. 2(B) is a section view of the same.

As shown in FIG. 1, circuit device 10 comprises conductive patterns, a circuit element 9, affixed onto a conductive pattern, and an insulating resin 14, which seals the conductive patterns and circuit element 9 while exposing at least the bottom surfaces of the conductive patterns, and has a configuration wherein recessed parts 15 are formed at parts of the side surfaces of the insulating resin 14, and side surface parts of the conductive patterns that are disposed at peripheral parts are exposed from recessed parts 15. In the figure, the conductive patterns comprise a die pad 11 and bonding pads 12, and side surfaces of bonding pads 12 that are disposed at peripheral parts of the device are exposed from side surfaces of the insulating resin 14. These respective components shall now be described.

The conductive patterns comprise die pad 11 and bonding pads 12. The conductive patterns are made of copper or other metal and are embedded in insulating resin 14 with their bottom surfaces exposed. Die pad 11 is disposed at a central part of the device, and circuit element 9 is affixed onto the upper part thereof via a brazing material. Die pad 11 is sealed by insulating resin 14 with its rear surface exposed. As shown in FIG. 2(A), bonding pads 12 are disposed at peripheral parts so as to surround die pad 11. Each bonding pad 12, disposed at a peripheral part, has its side surface that faces the exterior and its bottom surface exposed from insulating resin 14 and has its three side surfaces that do not face the exterior and its top surface sealed by the insulating resin. Recessed parts 15 are formed at side surfaces of insulating resin 14 at locations at which the side surfaces of bonding pads 12 are exposed, and side surfaces of bonding pads 12 are exposed from these recessed parts 15. Furthermore, a plating film 17 is formed on the top surfaces of die pad 11 and bonding pads 12.

Figure 2B:
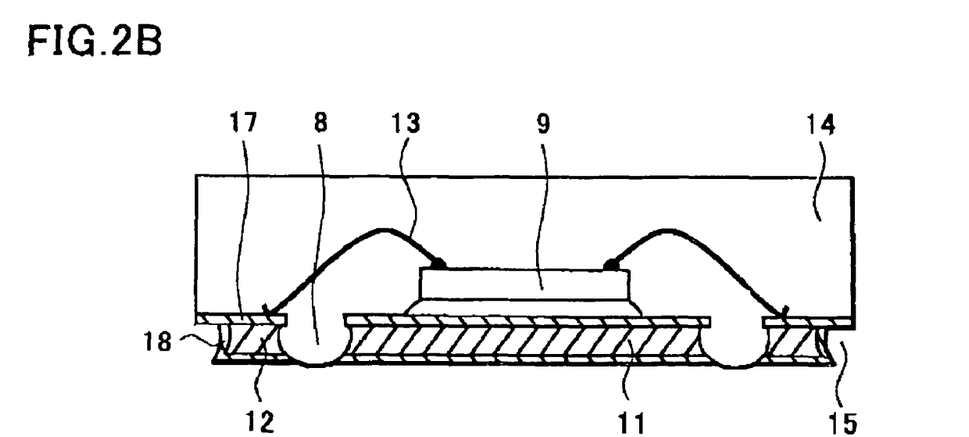

Referring now to FIG. 2(B), a plating layer 18 of silver, etc., is provided on surfaces of die pad 11 and bonding pads 12 that are exposed from insulating resin 14. Specifically, bonding pads 12 have plating layer 18 provided on their bottom surfaces. Bonding pads 12 have their side surfaces that face the exterior and their bottom surfaces covered by plating layer 18.

Here, a semiconductor element is used as circuit element 9, which is affixed via a brazing material onto die pad 11. The electrodes of circuit element 9 and bonding pads 12 are connected electrically via metal wires 13. Circuit element 9, which is a semiconductor element, may be mounted in a face-down manner. Furthermore, a plurality of other active elements or passive elements may be mounted in place of a semiconductor element.

Insulating resin 14 seals the entirety while exposing the rear surfaces of the conductive patterns. Here, circuit element 9, metal wires 13, die pad 11, and bonding pads 12 are sealed. As the material of insulating resin 14, a thermosetting resin formed by transfer molding or a thermoplastic resin formed by injection molding may be employed. With the preferred embodiment, recessed parts 15 are formed at side surface of circuit device 10 that are formed of insulating resin 14. Side surface of bonding pads 12 are exposed from recessed parts 15. Also as shown in FIG. 2(B), plating film 17 is exposed from recessed parts 15.

Figure 3A:
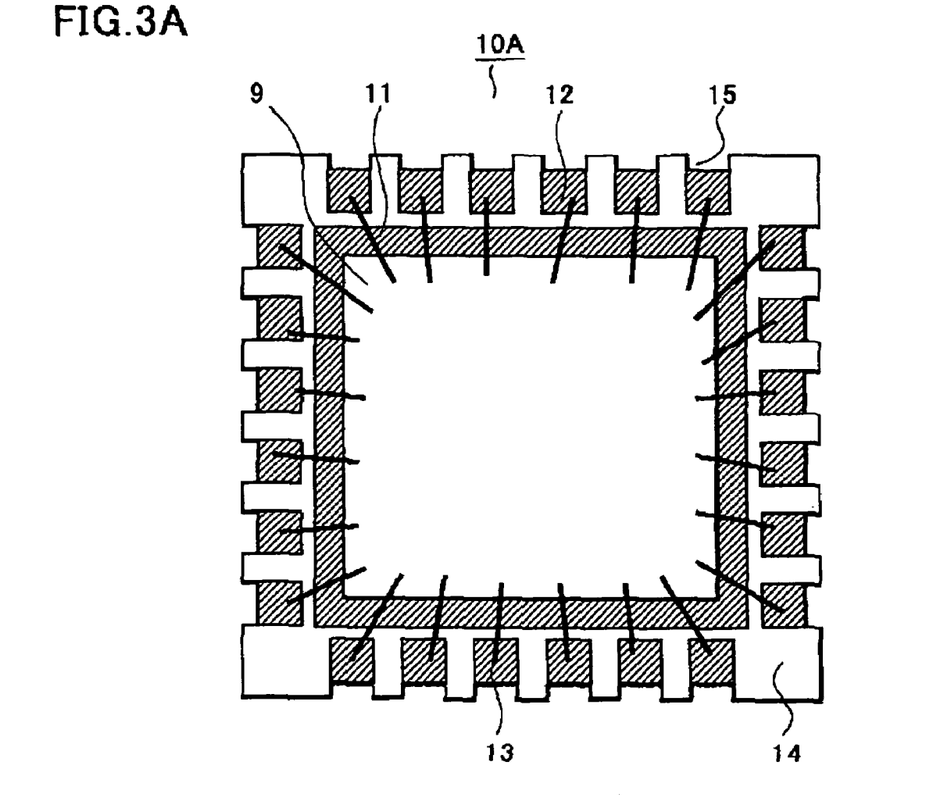

The configuration of circuit device 10A of another form shall now be described with reference to FIG. 3. Circuit device 10A, shown in this figure, comprises conductive patterns that are separated electrically by grooves 16, a circuit element 9, affixed onto a conductive pattern, and an insulating resin 14, which seals the conductive patterns and circuit element 9 while exposing at least the bottom surfaces of the conductive patterns, and has a configuration wherein recessed parts 15 are formed at parts of the side surfaces of insulating resin 14, and side surface parts of the conductive patterns that are disposed at peripheral parts are exposed from recessed parts 15. In the figure, the conductive patterns comprise a die pad 11 and bonding pads 12, and side surfaces of bonding pads 12 that are disposed at peripheral parts of the device are exposed from side surfaces' of the resin.

The differences with respect to circuit device 10 shown in FIG. 1 and FIG. 2 shall now be described. Circuit device 10A differs from circuit device 10 in the shapes of the conductive patterns that form die pad 11 and bonding pads 112. With circuit device 10A shown in the figure, die pad 11 and bonding pads 12 extend below insulating resin 14, which fills separation grooves 8. Die pad 11 and bonding pads 12 are electrically separated by grooves 16.

Figure 3B:
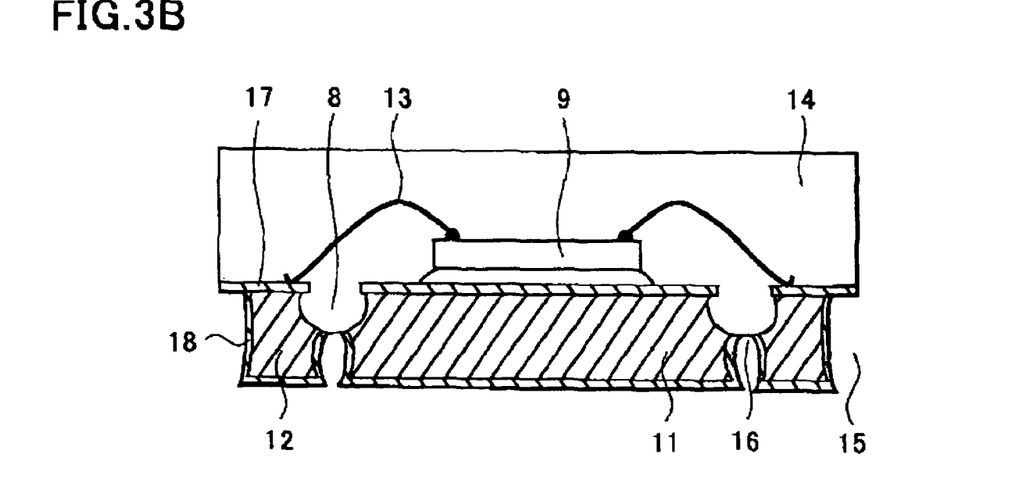

Referring now to FIG. 3(B), die pad 11 has its bottom surface and a part of its side surface exposed from insulating resin 14 and covered by a plating layer 18. Die pad 11 has its bottom surface and its side surface that face the exterior exposed from insulating resin 14. Furthermore, in regard to the side surfaces of bonding pads 12 that do not face the exterior, parts thereof are exposed from insulating resin 14. The side surfaces and bottom surfaces of bonding pads 12 that are exposed from insulating resin 14 are covered by plating layer 18.

The configuration of circuit device 10 of another form shall now be described with reference to FIG. 4. The configuration of circuit device 10 shown here is the same in basic structure as the circuit device shown in FIG. 1, and the difference is that the top surfaces of the conductive patterns, comprising die pad 11 and bonding pads 12 are covered by a covering resin 7. Besides the top surfaces of the conductive patterns, covering resin 7 also covers the top surfaces of separation grooves 8. An opening 7A is formed on the top surface of each bonding pad 12, and the surface of bonding pad 12 is partially exposed from the bottom part of opening 7A. The exposed surfaces of bonding pads 12 are electrically connected with circuit element 9 via metal wires 13.

A thermosetting resin or a thermoplastic resin may generally be used as the material of covering resin 7. Also, a photosensitive resin or a non-photosensitive resin may be used as covering resin 7. In the case where covering resin 7 is a photosensitive resin, openings 7A can be formed by performing exposure and development. Also in the case where covering resin 7 is a non-photosensitive resin, openings 7A can be formed by using a laser.

The configuration in which circuit device 10, shown in FIG. 1, is affixed to a mounting substrate 9 shall now be described with reference to FIG. 5.

Figure 5A:
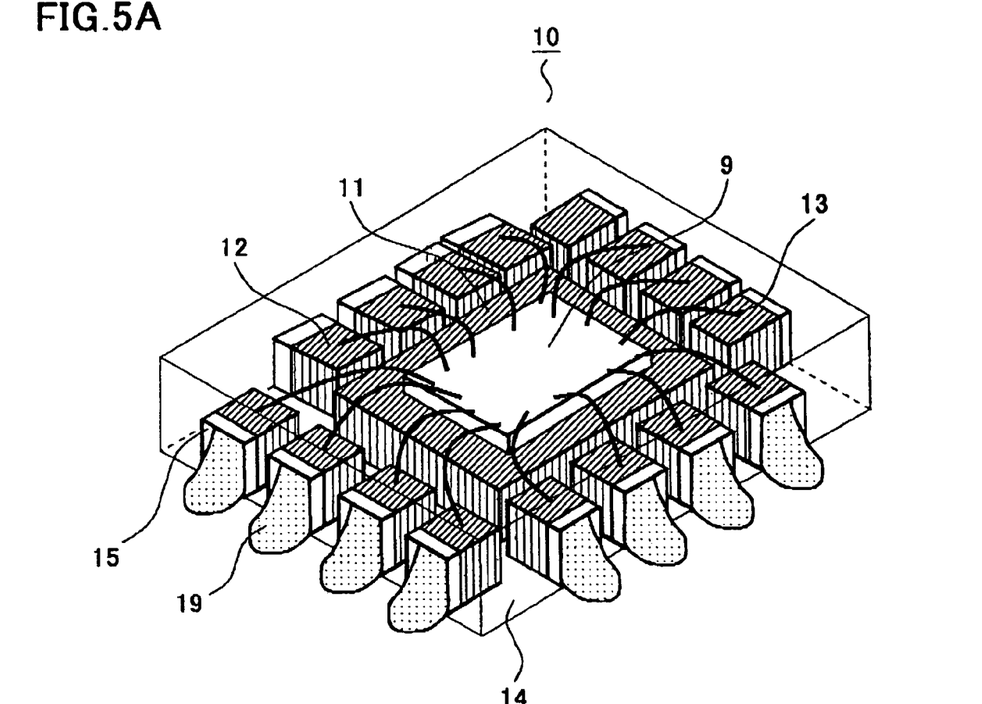
Figure 5B:
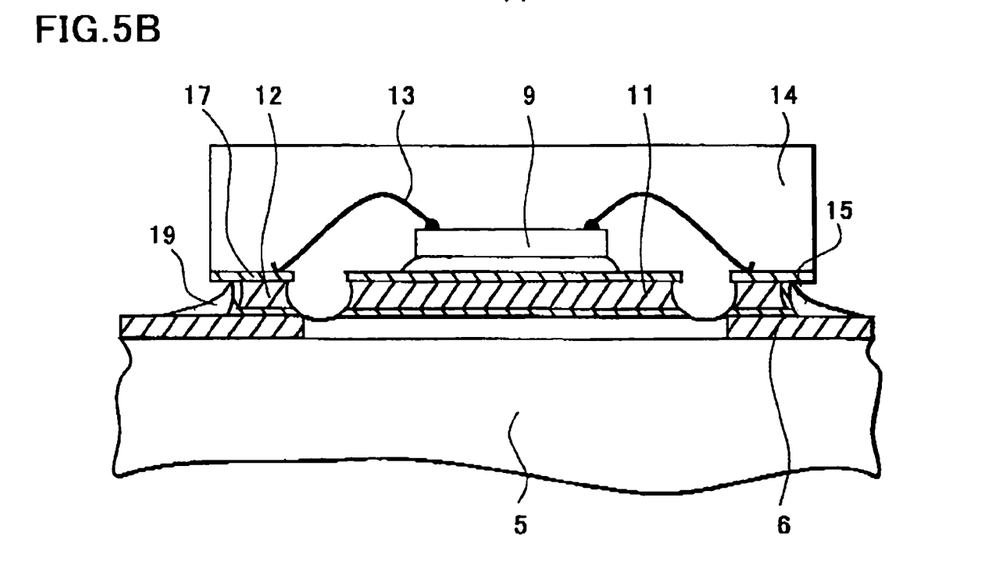

As shown in FIG. 5(A) and FIG. 5(B), by applying soft solder or other brazing material 19 to the side surface of bonding pads 12 that are exposed at side surface of circuit device 10, conductive paths 6 on mounting substrate 5 can be electrically connected to circuit device 10. Here, brazing material 19 contacts the exposed side surfaces of bonding pads 12 and the surface of conductive path 6 and form fillets.

An advantage of this embodiment exists in that side surfaces of bonding pads 12 are exposed from insulating resin 14. Specifically, side surfaces of bonding pads 12 are exposed from recessed parts 15 formed on side surfaces of insulating resin 14. Thus in mounting circuit device 10 to conductive paths 6 on mounting substrate 5, fillets formed of brazing material 19 can be formed at the exposed side surfaces of bonding pads 12 and conductive paths 6. By fillets of brazing material 19 being formed at peripheral parts of circuit device 10, whether or not brazing material 19 has been formed appropriately can be checked visually.

Furthermore, an advantage of the preferred embodiment exists in that recessed parts 15 are formed at side surfaces of insulating resin 14 at which bonding pads 12 are exposed. Specifically, the side surfaces of bonding pads 12 that are exposed to the exterior are positioned to the inner side of side surfaces of insulating resin 14 that forms the outer shape of the device. The peeling off of bonding pads 12 from the insulating resin in the stage of conveying circuit device 10 as a completed product can thus be prevented. Also, since the upper end parts of the fillets of brazing material 19 that are formed in the process of mounting circuit device 10 are contained in recessed parts 15, the peeling of brazing material 19 can be prevented as much as possible.

Second Embodiment for Describing a Method of Manufacturing Circuit Device 10

A circuit device 10 of the preferred embodiment is manufactured by the following steps. That is, these are the steps of: preparing a conductive foil 20 and forming separation grooves 8 that are shallower than the thickness of conductive foil 20 at least at regions of conductive foil 20 except regions to be conductive patterns that form a plurality of mounting portions 25 for circuit elements 9; affixing circuit elements 9 onto the respective mounting portions 25 of the desired conductive patterns; performing unified molding with an insulating resin 13 so as to cover circuit elements 9 at the respective mounting portions 25 in a batch and fill separation grooves 8; removing conductive foil 20 at thickness parts, at which separation grooves 8 are not formed, until insulating resin 13 is exposed; removing the conductive patterns at locations corresponding to boundary lines of the respective mounting portions 25 to form grooves and thereby expose side surface parts of the abovementioned conductive patterns; and performing separation by dicing the abovementioned insulating resin along the abovementioned boundary lines.

The present embodiment of circuit device 10 can also be manufactured by the following steps. That is, these are the steps of: preparing a conductive foil 20 and forming separation grooves 8 that are shallower than the thickness of conductive foil 20 at least at regions of conductive foil 20 besides regions to be conductive patterns that form a plurality of mounting portions 25 for circuit elements 9; affixing circuit elements 9 onto the respective mounting portions 25 of the desired conductive patterns; performing unified molding with an insulating resin 13 so as to cover circuit elements 9 at the respective mounting portions 25 in a batch and fill separation grooves 8; removing the remaining thickness parts of separation grooves 8 to electrically separate the conductive patterns and removing the conductive patterns at locations corresponding to boundary lines of the respective mounting portions 25 to form grooves 16 and thereby expose side surface parts of the conductive patterns; and performing separation by dicing insulating resin 13 along boundary lines. The respective steps of the preferred embodiment shall now be described with reference to FIG. 6 to FIG. 17.

Figure 6A:
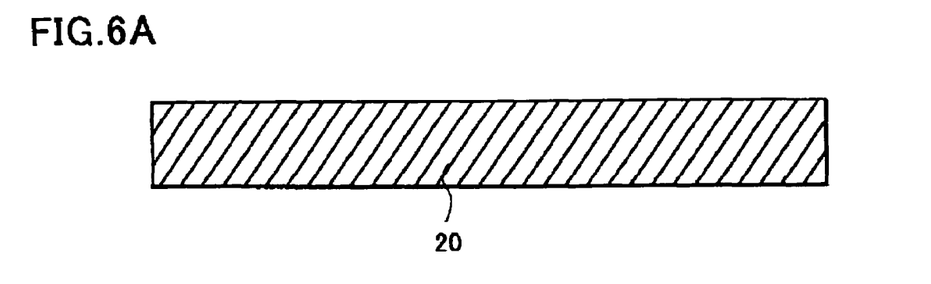
Figure 6B:
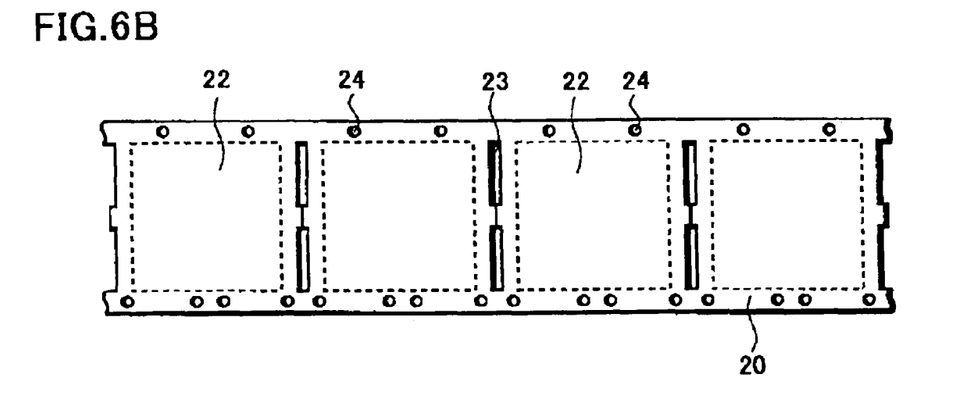
Figure 7:
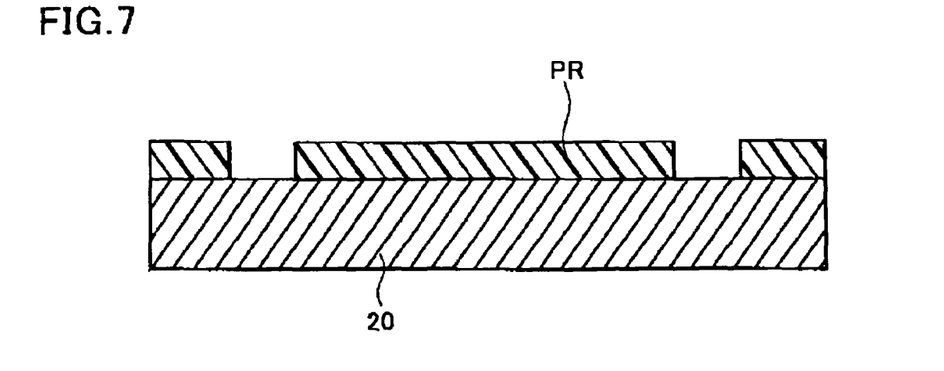
FIG. 7 is a sectional view showing a circuit device manufacturing method of the present embodiment.
Figure 8A:
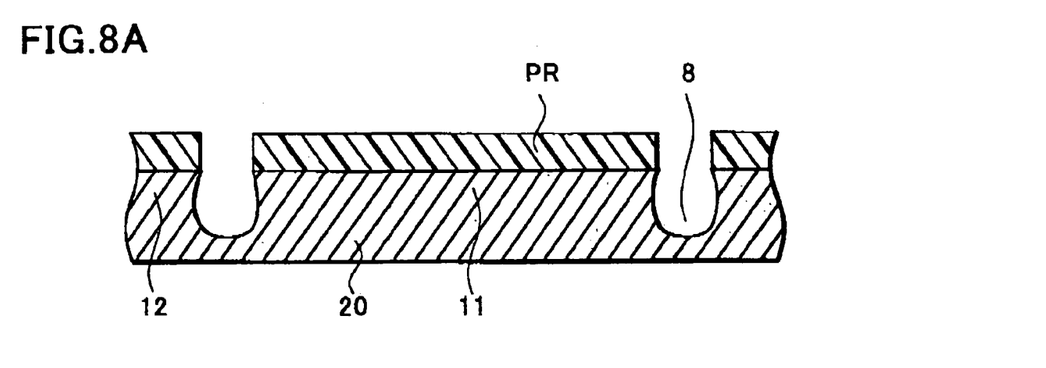
Figure 8B:
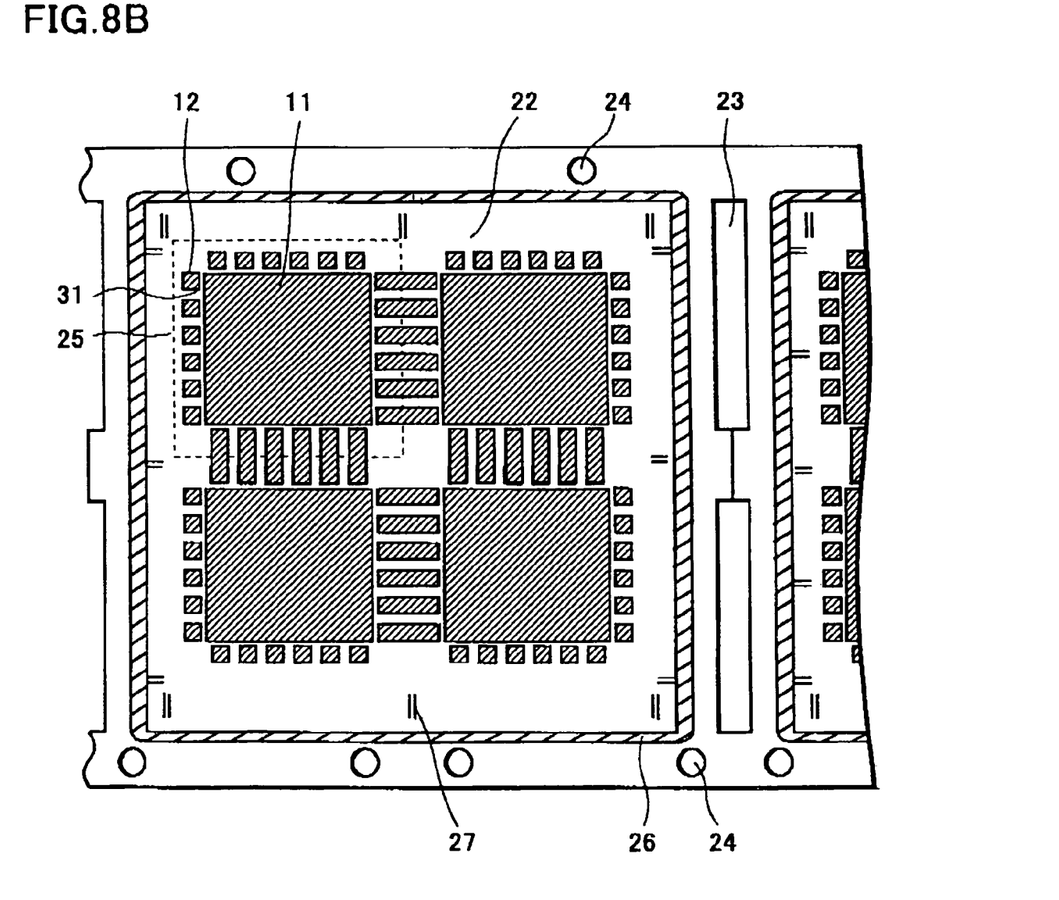

As shown in FIG. 6 to FIG. 8, in the first step of the preferred embodiment, a conductive foil 20 is prepared and separation grooves 8 that are shallower than the thickness of conductive foil 20 are formed at least at regions of conductive foil 20 except regions that are to be conductive patterns, which are to form a plurality of mounting portions 25 for circuit elements 9.

In this step, first, a sheet-form conductive foil 20 is prepared as shown in FIG. 6(A). The material of this conductive foil 20 is selected in consideration of brazing material attachment property, bonding property, and plating property, and as this material, a conductive foil having Cu as the principal material, a conductive foil having Al as the principal material, or a conductive foil formed of an alloy, such as Fe—Ni, etc., is employed. In regard to the thickness of conductive foil 20, though approximately 10 μm to 300 μm is preferable in consideration of subsequent etching, basically, the thickness may also be 300 μm or more or 10 μm or less. As shall be described below, it is sufficient that it be possible to form separation grooves 8, which are shallower than the thickness of conductive foil 20.

Specifically as shown in FIG. 6(B), four to five blocks 22, on which a plurality of mounting portions 25 will be formed, are aligned in a spaced manner along conductive foil 20 of strip-like form. Between each block 22 are provided slits 23 that absorb the stress that arises in a heating process in the molding step, etc. Also, index holes 24 are provided at fixed intervals at the upper and lower peripheral edges of conductive foil 20 and these are used for positioning in the respective steps. Conductive patterns are formed subsequently.

First, as shown in FIG. 7, a photoresist PR is patterned on the conductive foil 20 so that conductive foil 20 will be exposed at regions except regions that are to be the conductive patterns that form bonding pads 12 and die pads 11. Conductive foil 20 is then etched selectively as shown in FIG. 8(A).

Specific conductive patterns are shown in FIG. 8(B). In this figure, conductive patterns corresponding to one of blocks 22 shown in FIG. 6(B) are shown in enlarged manner. A region surrounded by dotted lines is one mounting part 25, and on one block 22, a plurality of mounting portions 25 are aligned in the form of a matrix of two rows and two columns, and the same conductive patterns are formed at each mounting part 25. A frame-like pattern 26 is provided at the periphery of each block, and positioning marks 27, used in the dicing step, are provided at the inner side and somewhat spaced from this pattern. Frame-like pattern 26 is used for fitting with a molding die and also has the function of reinforcing insulating resin 14 after rear surface etching of conductive foil 20. Here, the conductive patterns form a die pad 11 and bonding pads 12 at each mounting part 25. Furthermore, bonding pads 12 of mounting portions 25 that are positioned adjacent each other in matrix form are formed to be long and continuous. The bonding pads 12 that are formed to be long are etched in a subsequent step and thereby separated electrically.

Figure 9A:
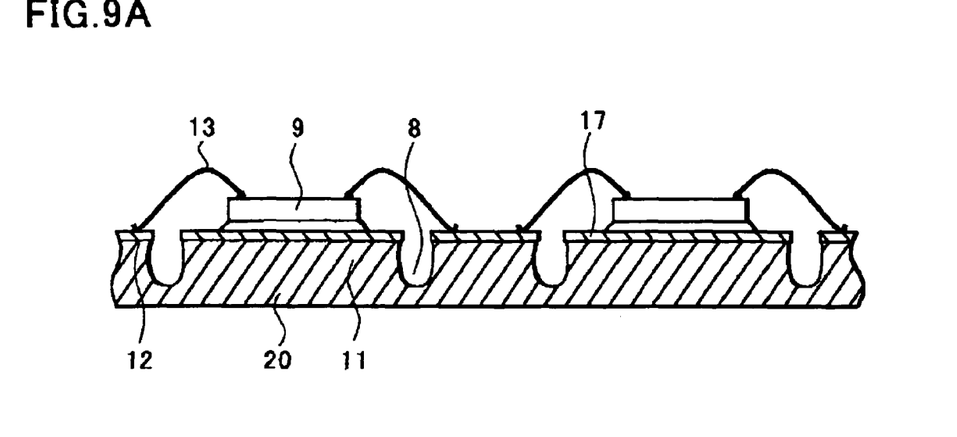
Figure 9B:
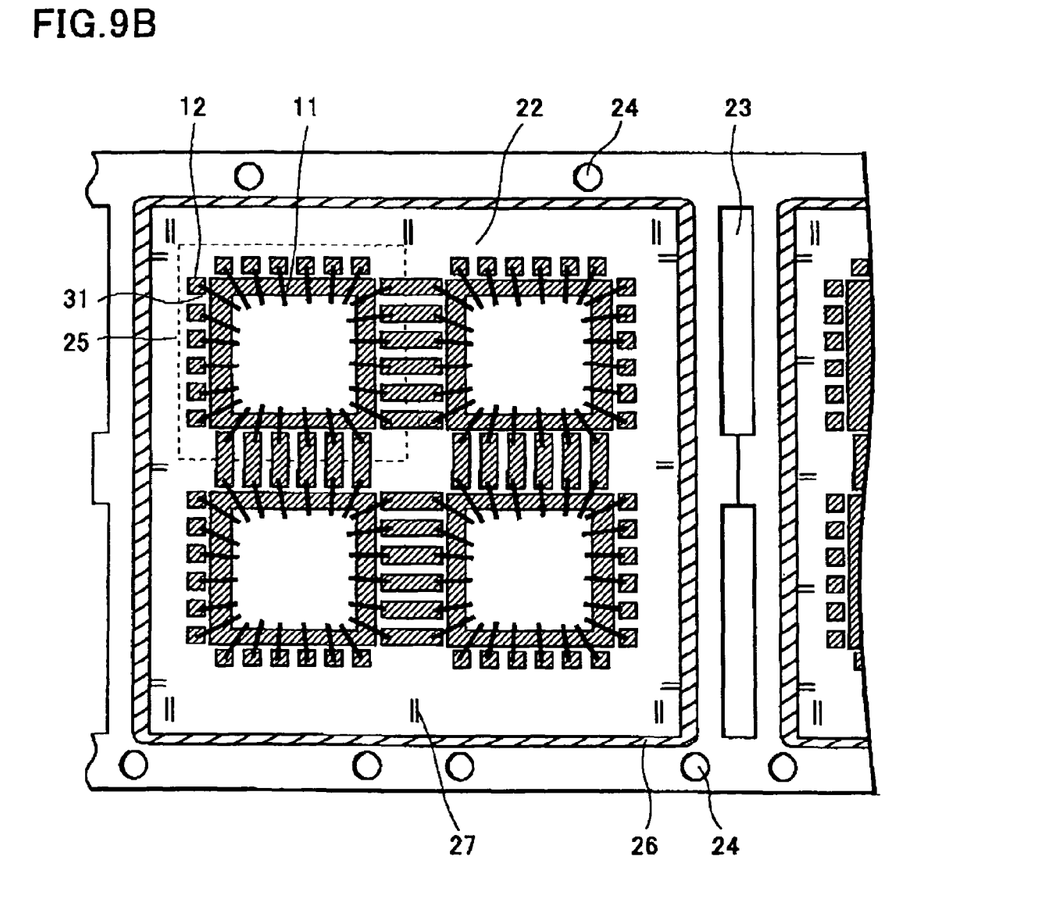

As shown in FIG. 9, in the second step of the preferred embodiment, circuit elements 9 are affixed onto the respective mounting portions 25 of the desired conductive patterns and the electrodes of circuit element 9 are wire bonded to the desired conductive patterns.

Here, semiconductor elements are affixed, as circuit elements 9 onto die pads 11. Thereafter, the respective electrodes of circuit element 9 of each mounting part are wire bonded in a batch by ball bonding by hot pressing and wedge bonding by ultrasonic waves.

Figure 10A:
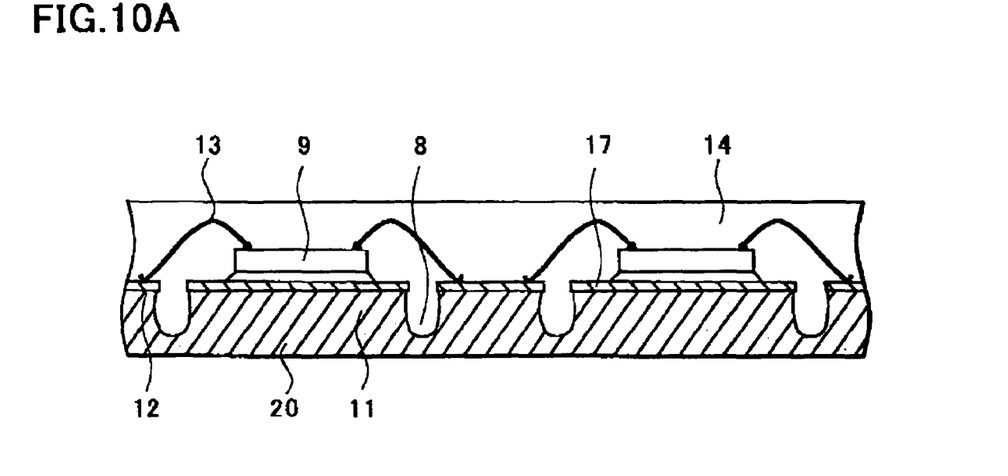
Figure 10B:
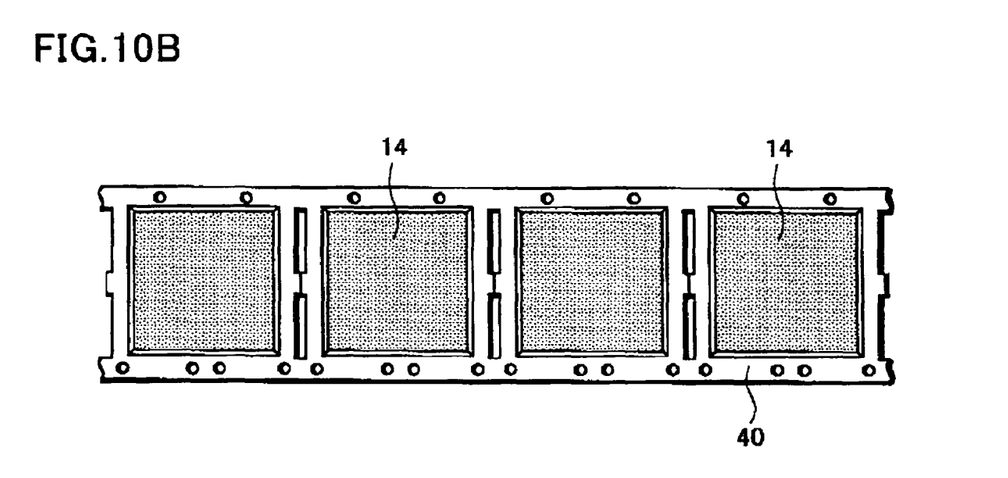

As shown in FIG. 10, in the third step of the preferred embodiment, unified molding with an insulating resin 13 is performed so as to cover circuit elements 9 at the respective mounting portions 25 in a batch and fill separation grooves 8.

As shown in FIG. 10(A), in this step, insulating resin 14 covers circuit elements 9 and the plurality of conductive patterns, and insulating resin 14 fills separation grooves 8 and fits and binds strongly with separation grooves 8. The conductive patterns are thus supported by insulating resin 14.

This step may be realized by transfer molding, injection molding, or potting. With regard to the resin material, an epoxy resin or other thermosetting resin may be used for transfer molding, or a polyimide resin, polyphenylene sulfide, or other thermoplastic resin may be used for injection molding.

Furthermore, in performing transfer molding or injection molding in this step, mounting portions 25 of each block 22 are contained in a single common mold die and, with each block, molding with a single insulating resin 14 is performed in a unified manner.

An advantage of this method is that the conductive foil 20 that becomes the conductive patterns serves as the supporting substrate until it is covered by insulating resin 14. Also, since separation grooves 8 are formed to be shallower than the thickness of the conductive foil, conductive foil 20 is not separated individually as the conductive patterns. Conductive foil 20 can thus be handled integrally as a sheet-form foil and provides the advantage that, in the process of molding insulating resin 14, the work of conveying to a mold and mounting in a mold are extremely facilitated.

Figure 11:
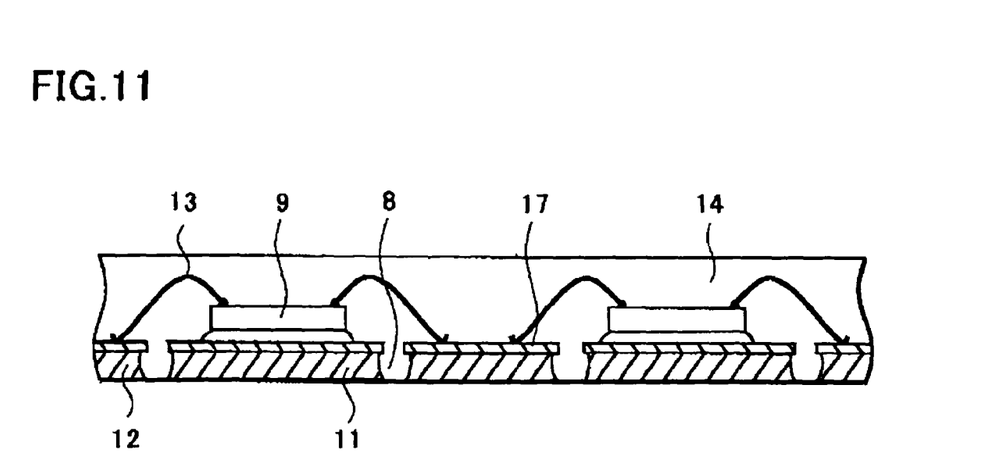
FIG. 11 is a sectional view showing a circuit device manufacturing method of the present embodiment.
Figure 12:
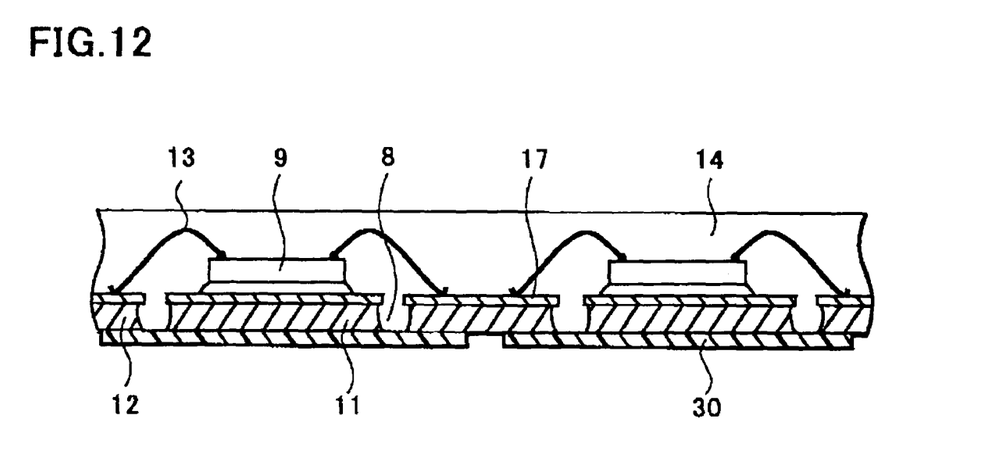
FIG. 12 is a sectional view showing a circuit device manufacturing method of the present embodiment.
Figure 13:
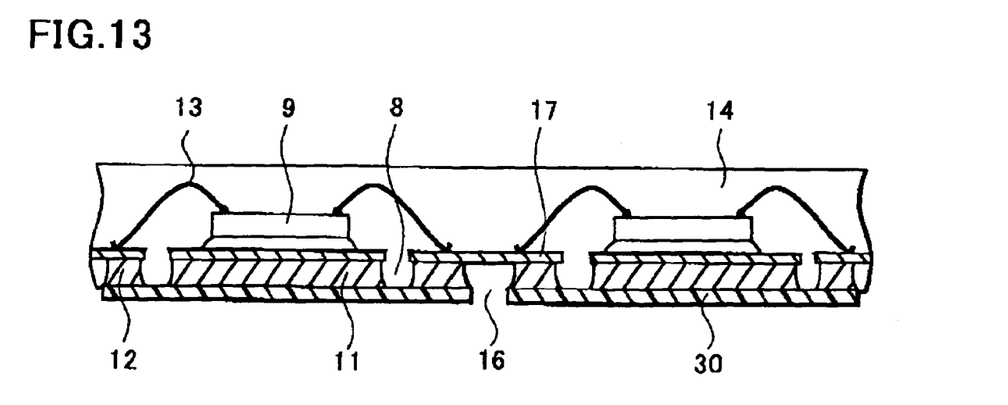
FIG. 13 is a sectional view showing a circuit device manufacturing method of the present embodiment.

Referring now to FIG. 11 to FIG. 13, in the fourth step of the preferred embodiment, conductive foil 20 is removed at thickness parts, at which separation grooves 8 are not formed, and the conductive patterns at locations corresponding to boundary lines of the respective mounting portions 25 are removed to form grooves 16 and thereby expose side surface of the conductive patterns.

In this step, the rear surface of conductive foil 20 is removed chemically and/or physically and separated into the conductive patterns. This step is performed by lapping, grinding, etching, metal vaporization by a laser, etc. Experimentally, the entire surface of conductive foil 20 is wet etched and insulating resin 14 is exposed from separation grooves 8. As a result, die pads 11 and bonding pads 12 are formed and separated electrically. Consequently, a structure is provided in which the rear surfaces of the conductive patterns are exposed from insulating resin 14.

Referring now to FIG. 12, in order to remove bonding pads 12 at locations corresponding to the boundary lines of the respective mounting portions 25, the rear surface is covered with an etching resist. Openings are formed in etching resist 30 at the boundary parts of the respective mounting portions 25, and the width of each of these openings is made greater than the width of the blade for performing dicing. The width of each opening may also be made greater than the length obtained by summing the width of the dicing blade and its positional precision.

By then performing etching as shown in FIG. 13, bonding pads 12 at locations corresponding to the boundary lines of the respective mounting portions 25 are removed to form grooves 16. Furthermore, grooves 16 are formed so that side surfaces of bonding pads 12 that are positioned at the peripheral edge parts of block 22 will be exposed. By thus performing etching upon setting the width of each opening of the etching resist to be longer than the blade for performing dicing, just insulating resin 14 can be cut in the step of performing dicing. The occurrence of "burrs" that arise as a result of dicing metal can thus be prevented. Furthermore, recessed parts 15 are thereby formed at locations of insulating resin 14 at which side surfaces of bonding pads 12 are exposed.

Another form of the fourth step of the preferred embodiment shall now be described with reference to FIG. 14 and FIG. 15. In this step, the remaining thickness parts of separation grooves 8 are removed to electrically separate the conductive patterns and the conductive patterns at locations corresponding to boundary lines of the respective mounting portions 25 are removed to form grooves 16 and thereby expose side surface of the conductive patterns.

Figure 14:
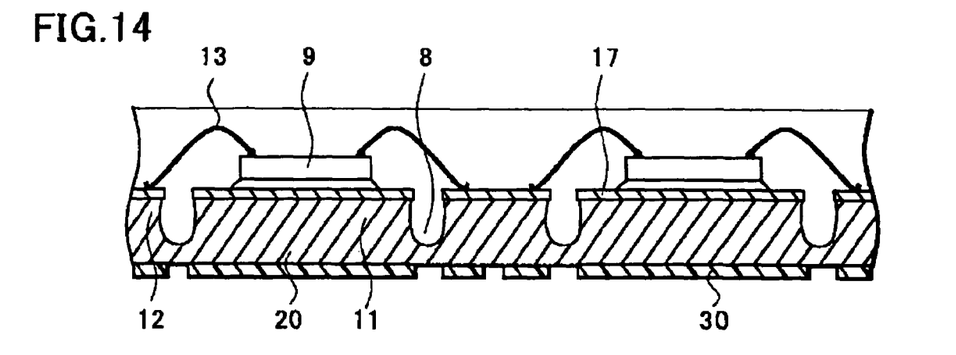
FIG. 14 is a sectional view showing a circuit device manufacturing method of the present embodiment.

First as shown in FIG. 14, an etching resist 30 is formed while exposing the rear surface of conductive foil 20 at the locations at which separation grooves 8 are formed and the rear surface of conductive foil 20 at locations corresponding to the boundary lines of the respective mounting portions 25.

Figure 15:
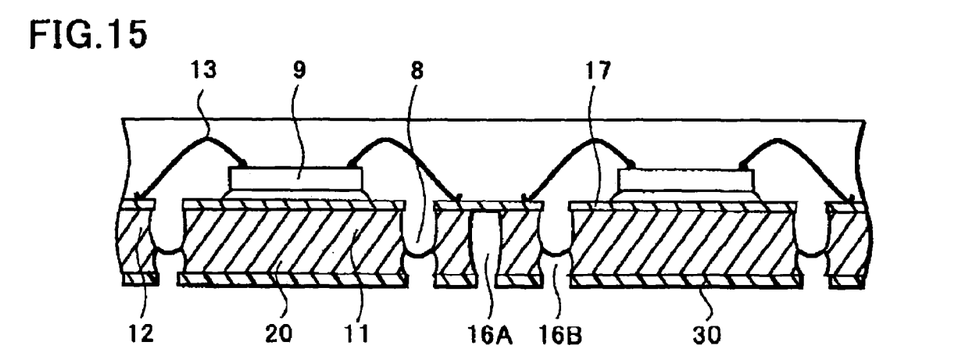
FIG. 15 is a sectional view showing a circuit device manufacturing method the present embodiment.

Then by performing etching as shown in FIG. 15, first grooves 16A and second grooves 16B are formed to electrically separate the respective conductive patterns. First grooves 16A electrically separate bonding pads 12 at the boundary lines of the respective mounting portions 25. Second grooves 16B serve the function of electrically separating die pad 11 and bonding pads 12 of each mounting part 25. Side surface of bonding pads 12 exposes from first grooves 16A.

In the above description, first grooves 16A and second grooves 16B were formed without performing overall removal of the rear surface of conductive foil 20. However, overall removal of the rear surface of conductive foil 20 may be performed to make conductive foil 20 thin to some degree and first grooves 16A and second grooves 16B may then be formed.

Figure 16:
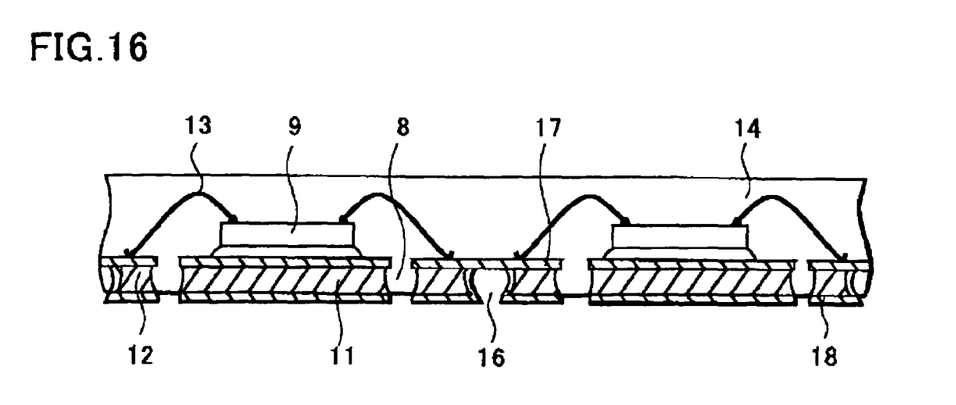
FIG. 16 is a sectional view showing a circuit device manufacturing method of the present embodiment.

In the fifth step of the preferred embodiment, a plating layer 18 is formed on the surfaces of the conductive patterns that are exposed from insulating resin 14 as shown in FIG. 16.

In this step, plating layer 18 is formed on die pads 11 and bonding pads 12 that are exposed from insulating resin 14, which seals the entirety. With die pads 11, plating layer 18 is formed on the bottom surfaces that are exposed from insulating resin 14. With bonding pads 12, plating layer 18 is formed on the side surfaces and bottom surfaces that are exposed from insulating resin 14. Here, plating layer 18 may be formed by an electrolytic plating method or by an on-electrolytic plating method. If plating layer 18 is to be formed by an electrolytic plating method, since bonding pads 12 and die pads 11 are electrically connected by metal wires 13 and plating film 17, a single bonding pad 12 or die pad 11 may be used as an electrode.

Figure 17A:
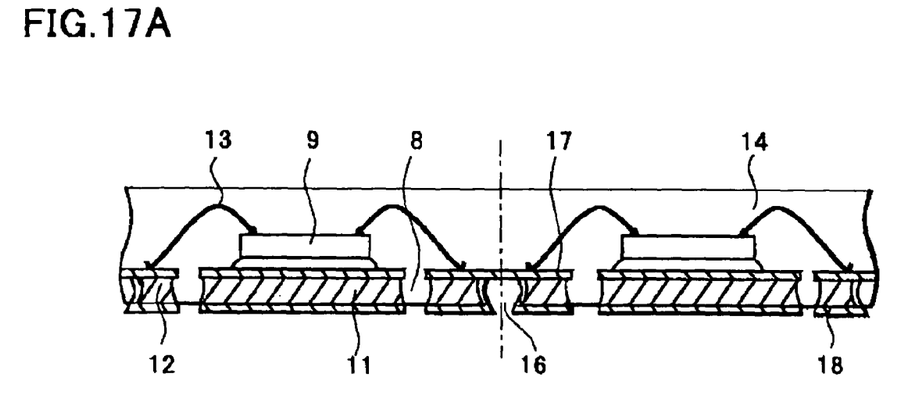
Figure 17B:
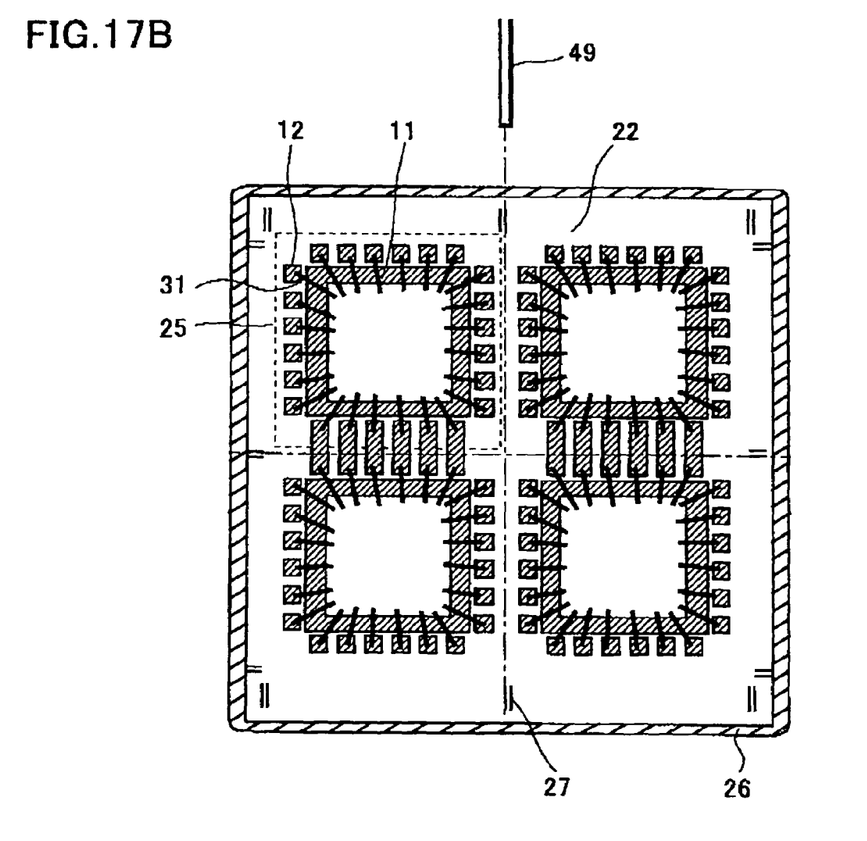

In the sixth step of the preferred embodiment, insulating resin 14 is separated by dicing according to the respective mounting portions 25 as shown in FIG. 17.

In this step, a block 22 is sucked by vacuum onto a setting base of a dicing device, and insulating resin 14 at separation grooves 8 is diced by a dicing blade 49 along dicing lines (alternate long and short dash line) between the respective mounting portions 25 and thereby separated into individual circuit devices.

In this step, dicing blade 49 dices at a cutting depth at which insulating resin 14 is cut substantially, and after block 22 is taken out from the dicing device, it is broken like chocolate by means of a roller. In the dicing step, the positioning marks 47 that were provided in the respective blocks in advance in the above-described first step are recognized and dicing is performed using these as reference points.

As described above, since grooves 16 are formed at locations corresponding to the dicing lines and bonding pads 12 are removed from these locations, insulating resin 14 and plating film 17 are removed here. A configuration is thus provided in which the side surfaces of bonding pads 12 at the locations at which grooves 16 are formed are exposed from the resin.

Figure 4A:
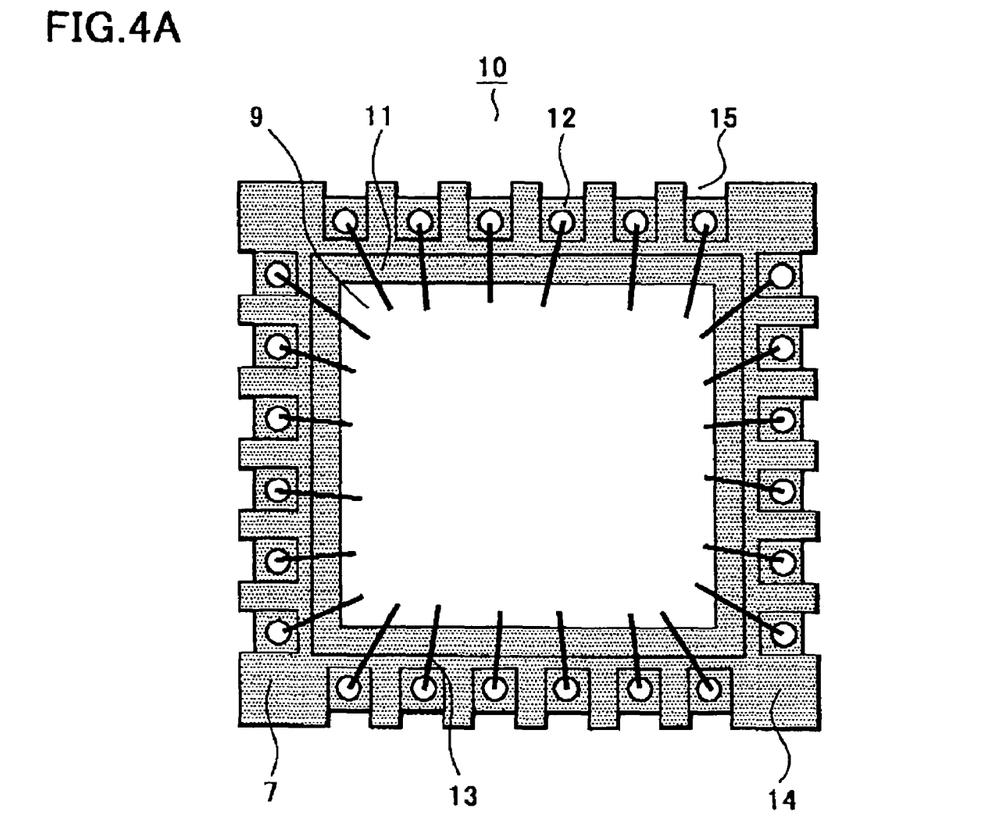
Figure 4B:
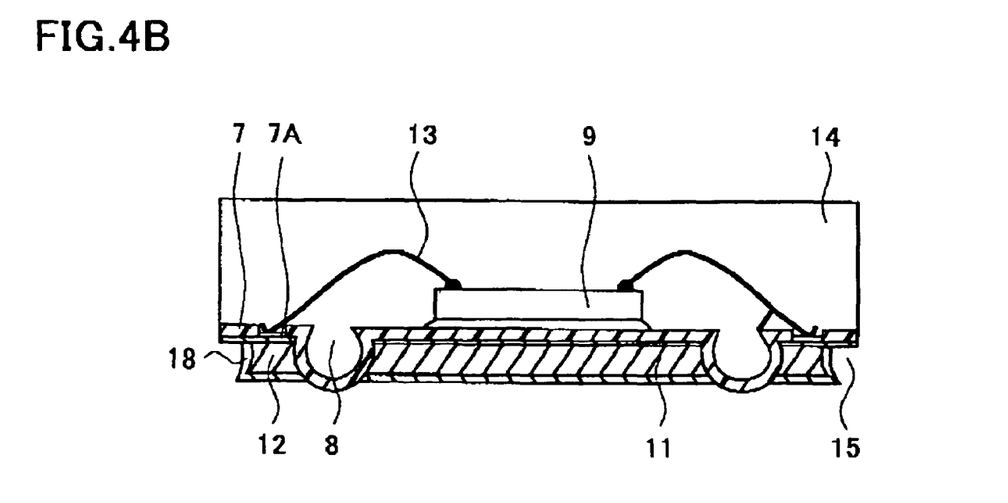

Also, though the method of covering the conductive patterns with insulating resin 13 was described above, in the case of manufacturing a circuit device such as that shown in FIG. 4, insulating resin 13 is formed after covering the conductive patterns with a covering resin 7 and forming openings 7A. By thus providing openings 7A and forming covering resin 7 on bonding pads 12, a plating layer can be formed at just the locations of openings 7A.

What is claimed is:

1. A circuit device comprising:
a conductive pattern; a circuit element, affixed onto the conductive pattern; and an insulating resin, sealing the conductive pattern and the circuit element while exposing at least a bottom surface of the conductive pattern;
wherein recessed areas are formed individually and are in side surfaces of the insulating resin such that outwardly facing outer peripheral parts of the conductive pattern are exposed from within the recessed areas, and
wherein the top surface of the circuit device consists of insulating resin.

2. The device of claim 1, wherein the circuit device is mounted by attaching brazing material to the exposed side surface and bottom surface of the conductive pattern.

3. The device of claim 1, wherein the circuit element is semiconductor element and the conductive pattern that is disposed at the peripheral part and the semiconductor element is connected electrically.

4. The device of claim 1, wherein the conductive pattern comprise die pad and bonding pad and circuit element is mounted on the die pad and the bonding pad is disposed so as to surround the die pad.

5. The device of claim 1, wherein a plating layer is formed on the rear surface and side surface of the conductive patterns that is exposed from the insulating resin.

6. The device of claim 1, wherein a covering resin is formed on the surface of the conductive pattern and the circuit element and the conductive pattern are electrically connected via opening provided in the covering resin.

7. The device of claim 6, wherein the covering resin comprises a photosensitive resin.

8. The circuit device of claim 1, wherein the circuit device is of a substantially hexahedron shape.

9. The circuit device of claim 1, wherein the outwardly facing outer peripheral parts of the conductive pattern are not aligned with a side surface of the insulating resin.

10. A circuit device comprising:
a conductive pattern; a circuit element, affixed onto the conductive pattern; and an insulating resin, sealing the conductive pattern and the circuit element while exposing at least a bottom surface of the conductive pattern;
wherein recessed areas are in side surfaces of the insulating resin such that outwardly facing outer peripheral parts of the conductive pattern are exposed from within the recessed areas and are not aligned with a side surface of the insulating resin, and
wherein the top surface of the circuit device consists of insulating resin.

* * * * *